United States Patent
Miyazawa et al.

(10) Patent No.: US 6,592,380 B2
(45) Date of Patent: Jul. 15, 2003

(54) CONNECTOR MODULE FOR INTEGRATED CIRCUIT DEVICE, AND INTEGRATED CIRCUIT DEVICE SUITABLE FOR USE WITH THE SAME

(75) Inventors: Masaaki Miyazawa, Kanagawa (JP); Taiji Hosaka, Kanagawa (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 09/836,479

(22) Filed: Apr. 18, 2001

(65) Prior Publication Data

US 2001/0036756 A1 Nov. 1, 2001

(30) Foreign Application Priority Data

Apr. 27, 2000 (JP) ......................................... 2000-128045

(51) Int. Cl.$^7$ .......................... H01R 12/00; H05K 1/00
(52) U.S. Cl. ....................... 439/67; 439/329; 439/357
(58) Field of Search .......................... 439/67, 329, 77, 439/357, 101, 497, 68, 780

(56) References Cited

U.S. PATENT DOCUMENTS

| | | | | |
|---|---|---|---|---|
| 3,399,372 A | * | 8/1968 | Uberbacher | 439/101 |
| 5,781,759 A | * | 7/1998 | Kashiwabara | 395/500 |
| 6,160,704 A | * | 12/2000 | Rusate | 361/697 |
| 6,212,278 B1 | * | 4/2001 | Bacon et al. | 380/240 |

\* cited by examiner

*Primary Examiner*—Javaid Nasri
(74) *Attorney, Agent, or Firm*—Rader, Fishman & Grauer PLLC

(57) ABSTRACT

A connector module to be connected to an integrated circuit device having rear electrodes provided on a back surface thereof facing away from a wiring board. The connector module includes: a connector having contacts to be electrically connected to the rear electrodes; and a fixture structure for fixing the connector to the integrated circuit device.

17 Claims, 9 Drawing Sheets

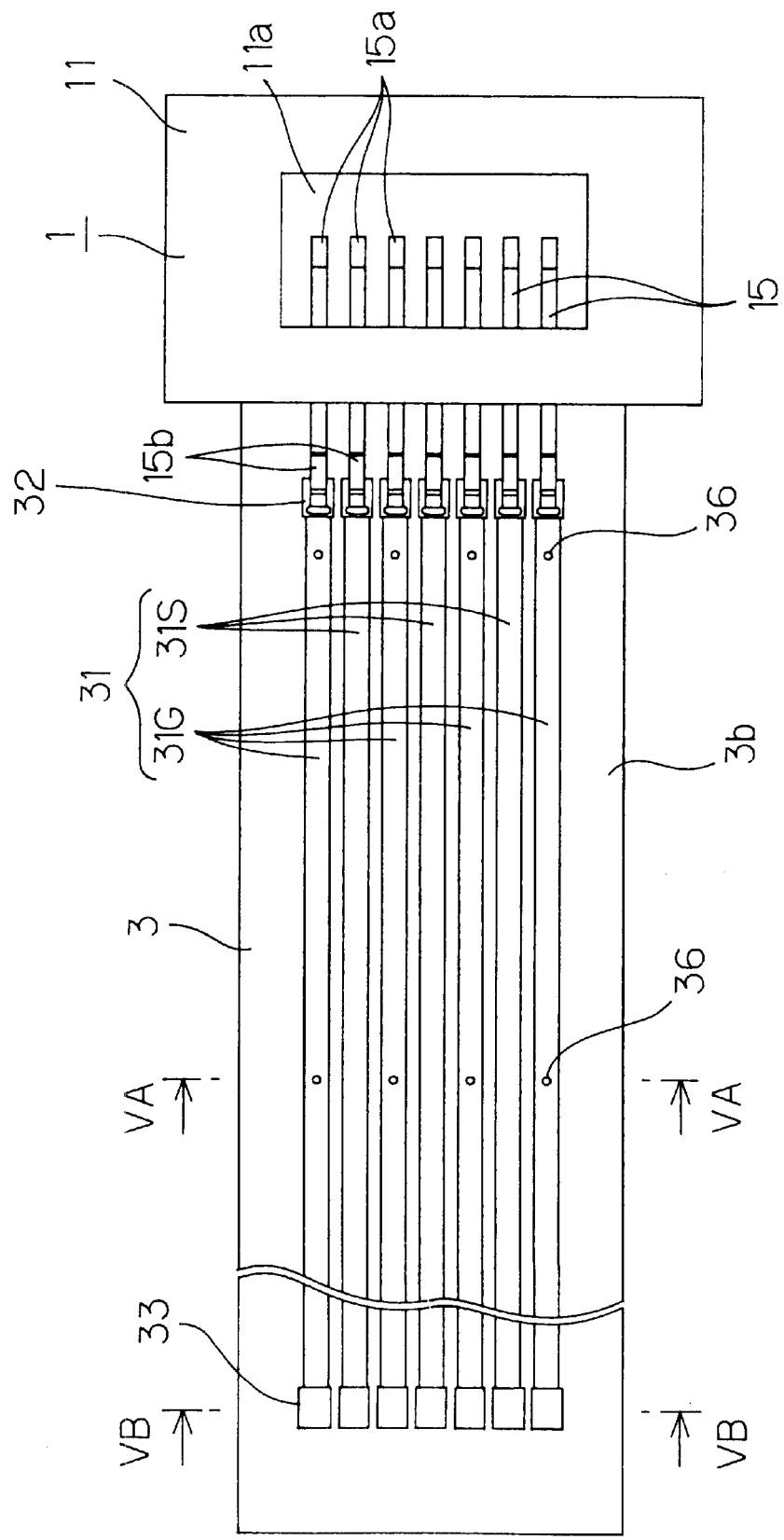

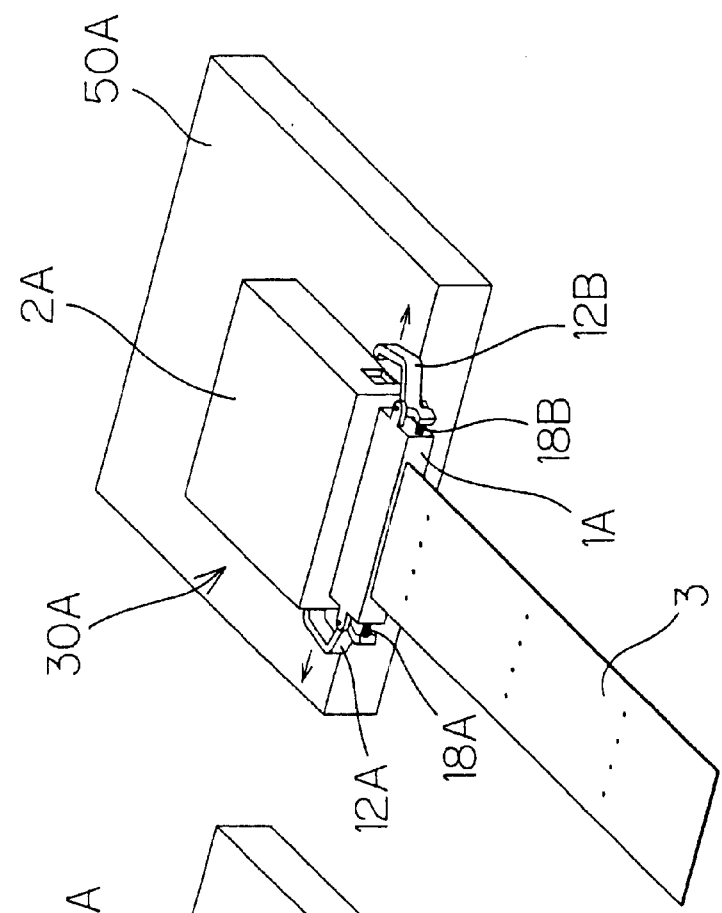
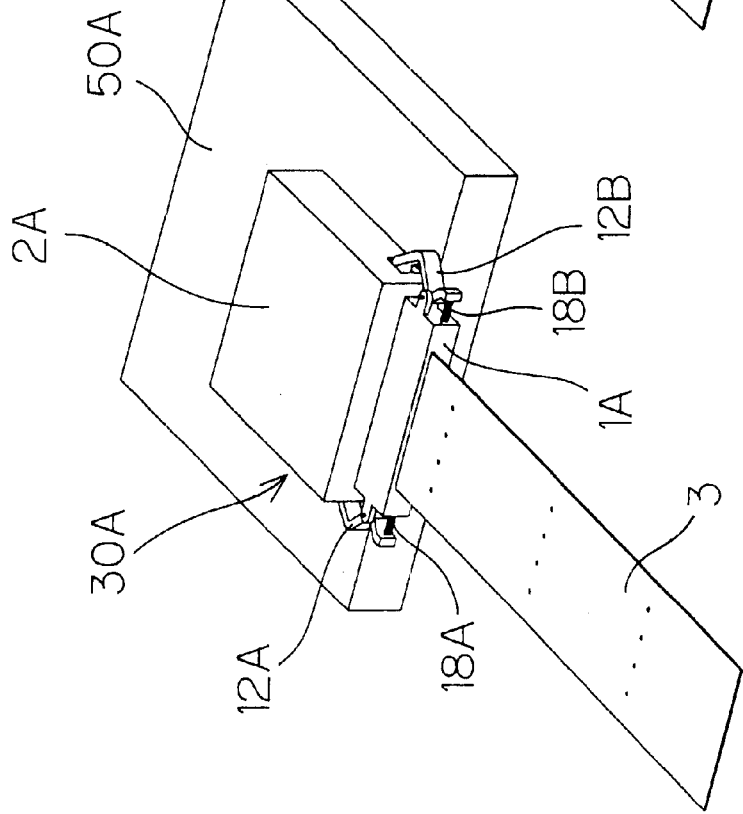

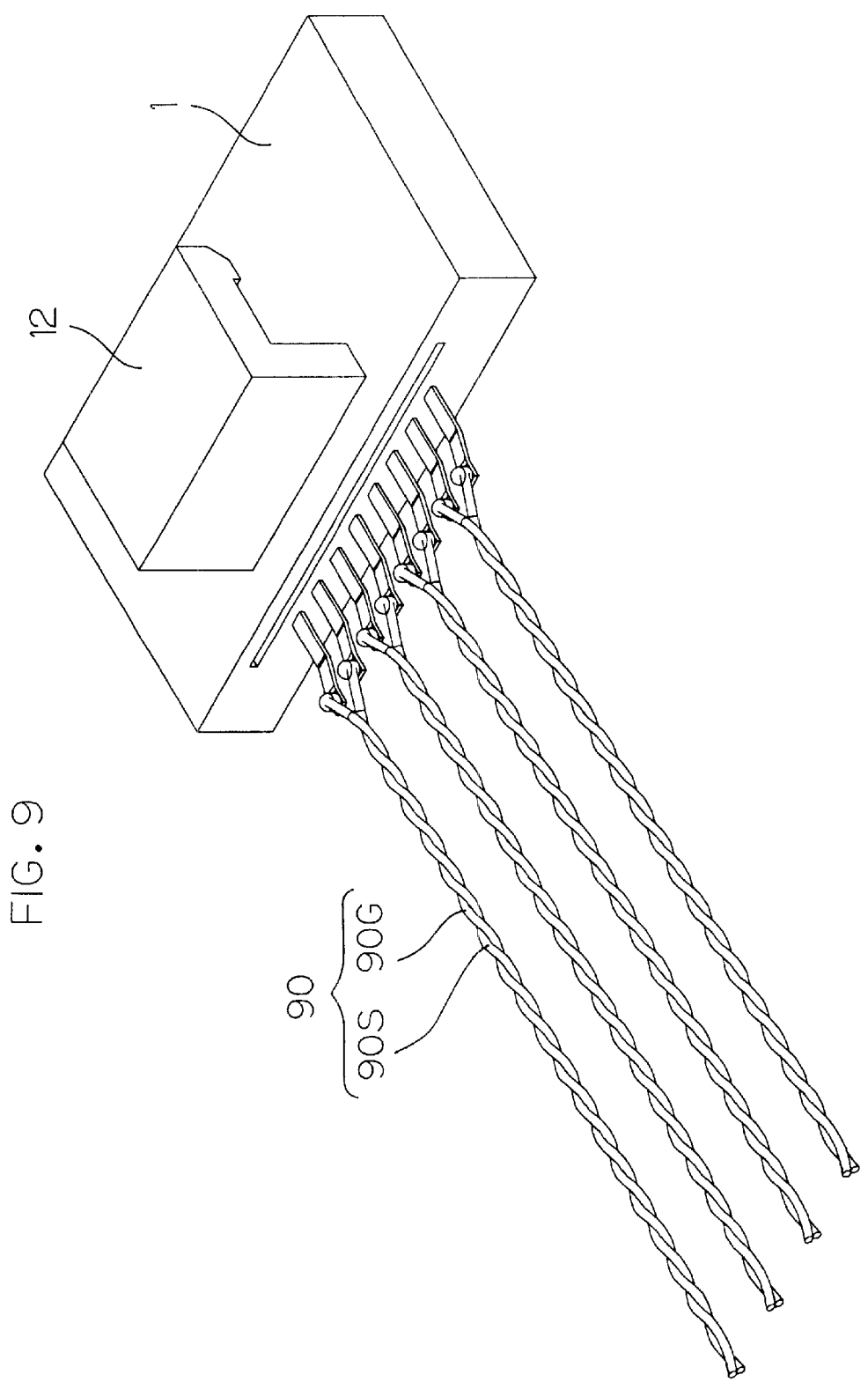

CONNECTOR MODULE FOR INTEGRATED CIRCUIT DEVICE, AND INTEGRATED CIRCUIT DEVICE SUITABLE FOR USE WITH THE SAME

BACKGROUND OF THE INVENTION

1. Field of the Invention

The present invention relates to a connector module for leading out signal lines from a back surface of an integrated circuit device, and to an integrated circuit device suitable for use with the connector module.

2. Description of Related Art

High speed signal input and output with respect to a semiconductor integrated circuit device mounted on a printed wiring board are generally achieved through micro-strip lines or strip lines provided in the wiring board. More specifically, the printed wiring board is constructed in a multi-level structure for the provision of the strip lines and the micro-strip lines, which are employed as impedance-matched transmission paths.

With the aforesaid arrangement, however, the dielectric constant of the printed wiring board, the capacitance and inductance of an interconnection pattern and the like should properly be conditioned for the high speed signal transmission. This requires advanced techniques for system development and design. In addition, a consideration should be given to an arrangement for overcoming drawbacks associated with noises and crosstalk and, hence, there are technical and economic problems.

Further, various semiconductor devices operative at different source voltages should be employed for operation of a high-speed system. Accordingly, a plurality of layers are separately provided in the printed wiring board for applying the different source voltages to the respective semiconductor devices. However, this arrangement deteriorates the electrical properties of the signal transmission paths and, when directed to the high-speed system, encounters technical difficulties. In addition, this arrangement may cause noises and crosstalk, which hinder the speed-up of the system.

An LVDS (low-voltage differential signaling) interface, for example, is employed for high speed data transmission in a liquid crystal display device. The LVDS interface is a small-amplitude and high-speed differential interface specified by EIA644/IEEE1596.3, and applicable to communications at frequencies up to 500 MHz. An LVDS-conformable differential driver (semiconductor device), which incorporates circuits for four channels, for example, achieves a data transmission rate of 400 Mbps by outputting 100-MHz differential signals from the respective channels.

Where such an LVDS differential driver device is to be mounted on a printed wiring board, a pseudo-coaxial circuit should be provided for elimination of crosstalk and noises by forming micro-strip lines on the printed board so that ground lines are disposed between signal lines.

However, the pseudo-coaxial circuit does not provide perfect coaxial transmission paths, so that crosstalk and noises are inevitably introduced even if the pseudo-coaxial circuit is provided on the multi-level printed wiring board. As a result, signals transmitted at a high transmission rate through the pseudo-coaxial circuit on the wiring board do not have sharp square waveforms. Therefore, this arrangement is not necessarily adaptable to applications for high speed digital data transmission.

Similar problems arise in the field of personal computers which are increasingly directed to higher speed operation. That is, a frequency employed for signal transmission between a CPU and a chip set is currently about 133 MHz to about 200 MHz, but will doubtlessly be increased to about 400 MHz to about 800 MHz. On the other hand, it is doubtful that the existing techniques for printed wiring boards can cope with such high speed signal transmission.

SUMMARY OF THE INVENTION

It is an object of the present invention to provide a connector module which realizes a connection structure adapted for higher speed signal transmission with respect to an integrated circuit device.

It is another object of the invention to provide an integrated circuit device having the aforesaid connector module.

It is further another object of the invention to provide an integrated circuit device having a construction suitable for attachment with the connector module.

The present invention is directed to a connector module (30, 30A, 30B) which is to be connected to an integrated circuit device (50, 50A, 50B) having rear electrodes (52) provided on a back surface (51) thereof facing away from a wiring board (70). The connector module includes a connector (1, 1A, 1B) having contacts (15) to be electrically connected to the rear electrodes, and a fixture structure (2, 2A, 2B, 12, 12A, 12B) for fixing the connector to the integrated circuit device.

Parenthesized alphanumeric characters denote corresponding components to be described later in embodiments of the invention, but do not intend to limit the invention to the embodiments. This definition is effectual in this section.

In the present invention, high speed signal transmission with respect to the integrated circuit device having the rear electrodes provided on the back surface thereof opposite from the board-opposed surface is achieved through external circuitry provided outside the wiring board. More specifically, the inventive connector module leads signal lines out of the integrated circuit device by attaching the connector thereof to the integrated circuit device with the contacts thereof connected to the rear electrodes of the integrated circuit device. Thus, transmission paths are provided outside the wiring board, so that the influences of inter-signal crosstalk and noises can be eliminated for proper high speed signal transmission.

Particularly where signals to be transmitted at a frequency of not lower than 50 MHz are allocated to signal lines led out of the device with the use of the connector module, the aforesaid effects are notable.

The integrated circuit device may have electrodes (63, 64) provided on the board-opposed surface thereof in addition to the rear electrodes (52) provided on the back surface thereof. In this case, high speed signal transmission can advantageously be achieved through the signal transmission paths outside the wiring board by allocating signals required to be transmitted at a high speed (e.g., higher than 50 MHz) to the rear electrodes.

The connector module may further include a wiring ember (3, 90) connected to the connector.

With this arrangement, the wiring member connected to the connector allows for signal transmission with respect to any other electronic devices via the transmission paths outside the wiring board.

The wiring member preferably has a pseudo-coaxial structure.

With this arrangement, the signal transmission paths are free from the influences of the inter-signal crosstalk and noises.

In this case, the pseudo-coaxial structure may be constituted by micro-strip lines and strip lines arranged such that signal lines are provided between ground lines or, alternatively, by twisted-pair cables.

The fixture structure preferably includes a connection block (2, 2A, 2B) which is fixable to the back surface of the integrated circuit device and engageable with the connector.

With this arrangement, electrical connection between the contacts of the connector and the rear electrodes of the integrated circuit device can be established by fixing the connection block to the back surface of the integrated circuit device and bringing the connection block into engagement with the connector.

The fixture structure preferably further includes lock mechanism (12, 22; 12A, 12B, 24) for keeping the connector and the connection block in engagement with each other.

With this arrangement, the connector and the connection block can be kept in engagement with each other by the lock mechanism, so that the electrical connection between the connector module and the integrated circuit device can assuredly be maintained. This ensures the reliability of the signal transmission paths outside the wiring board.

The connection block preferably incorporates a cooling mechanism (80) for cooling the integrated circuit device.

With this arrangement, sufficient heat dissipation from the integrated circuit device can be achieved by the cooling mechanism incorporated in the connection block attached to the back surface of the integrated circuit device. Thus, the inventive connector module can be applied to an integrated circuit device generating a greater amount of heat to provide signal transmission paths outside the wiring board.

The cooling mechanism may be radiator fins provided on the connection block to allow the connection block to double as a heat sink. The cooling mechanism may be a cooling fan provided in the connection block.

An integrated circuit device according to the present invention includes an integrated circuit device body having rear electrodes provided on a back surface thereof facing away from a wiring board, and the aforesaid connector module attached to the back surface of the integrated circuit device body.

With this arrangement, the integrated circuit device can receive and transmit signals via the signal transmission paths outside the wiring board. Thus, high speed signal transmission can be achieved through the advantageous signal transmission paths provided outside the wiring board with little limitation, so that the integrated circuit device can operate at a higher speed.

An integrated circuit device according to one embodiment of the present invention includes an integrated circuit device body having rear electrodes provided on a back surface thereof facing away from a wiring board, and a connection block fixed to the back surface of the integrated circuit device body for engagement with a connector having contacts to be electrically connected to the rear electrodes.

In accordance with the present invention, the connection block is fixed to the back surface of the integrated circuit device body. Therefore, the integrated circuit device can easily utilize the signal transmission paths outside the wiring board by connecting the connector of the connection module to the connection block.

The connection block may be formed integrally with a mold resin portion of the integrated circuit device. Alternatively, the connection block may be a separate member from the mold resin portion of the integrated circuit device, and fixed to the integrated circuit device body with an adhesive, by ultrasonic fusion bonding or by proper fixing means such as engagement claws.

The foregoing and other objects, features and effects of the present invention will become more apparent from the following description of the preferred embodiments with reference to the attached drawings.

BRIEF DESCRIPTION OF THE DRAWINGS

FIG. 4 is a bottom view illustrating the connector and an FPC cable;

FIG. 7A is a perspective view illustrating a state where a connector is attached to a connection block, and FIG. 7B is a perspective view for explaining how to detach the connector from the connection block;

FIG. 9 is a perspective view illustrating an exemplary arrangement where pseudo-coaxial transmission paths are constituted by twisted-pair cables.

DESCRIPTION OF THE PREFERRED EMBODIMENTS

Figure 1A:
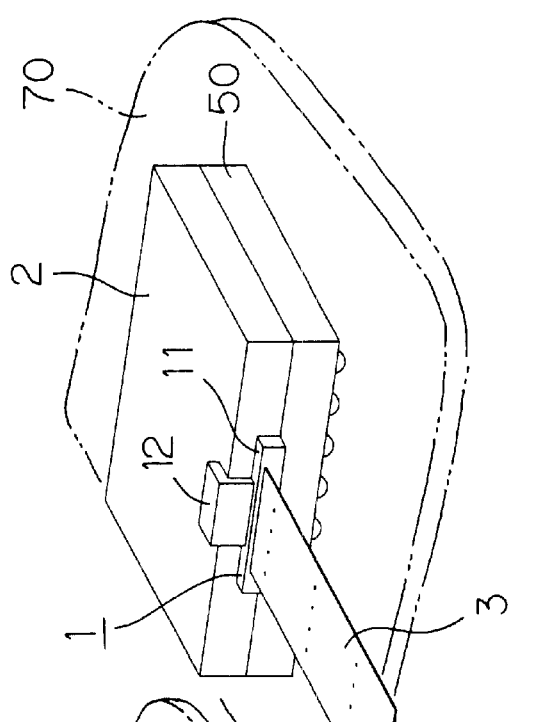
FIGS. 1A and 1B are perspective views for explaining the construction of a connector module according to a first embodiment of the present invention.
Figure 1B:
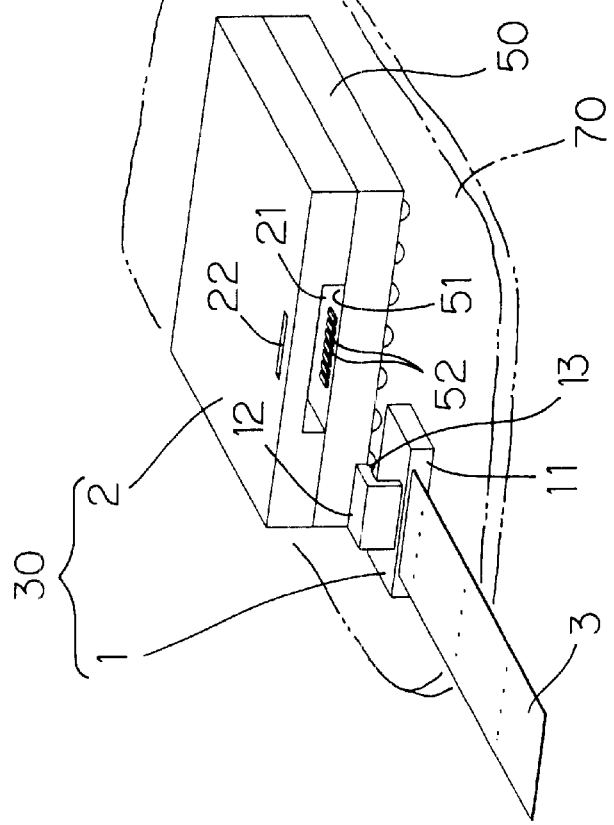

FIGS. 1A and 1B are perspective views for explaining the construction of a connector module according to a first embodiment of the present invention. The connector module according to this embodiment is to provide signal transmission paths outside a printed wiring board 70 with respect to a semiconductor integrated circuit device 50 (corresponding to the integrated circuit device body as a whole) mounted on the printed wiring board 70. For this purpose, the integrated circuit device 50 includes a plurality of rear electrodes 52 provided in the vicinity of an edge of a back surface (upper surface) 51 opposite from a surface (lower surface) opposed to the printed wiring board 70. The connector module 30 is electrically connected to the rear electrodes 52 for the provision of the signal transmission paths outside the printed wiring board 70.

The connector module 30 includes a planar rectangular connection block 2 fixed to the back surface 51 of the semiconductor integrated circuit device 50, for example, with an adhesive, and a connector 1 removably attachable to the connection block 2. The connection block 2 has an engagement recess 21 provided above the rear electrodes 52 for engagement with the connector 1. The connection block 2 further has a lock hole 22 provided above the engagement recess 21 for locking the connector 1 to the connection block 2 after the connector 1 is brought into engagement with the connection block 2.

The connector 1 includes a housing 11 having a rear face from which an FPC (flexible printed circuit) cable 3 is led out, and an engagement piece 12 of an inverted L-shaped cross section provided on an upper surface of the housing 11. The engagement piece 12 has a lock claw 13 provided at a distal edge thereof for locking the connector 1 in engagement with the lock hole 22. When the connector 1 is moved toward the connection block 2 in a state shown in FIG. 1A to insert the housing 11 of the connector 1 into the engagement recess 21, the lock claw 13 is fitted in the lock hole 22 at an insertion-complete position. Thus, the connector 1 is locked to the connection block 2 as shown in FIG. 1B.

Figure 2:
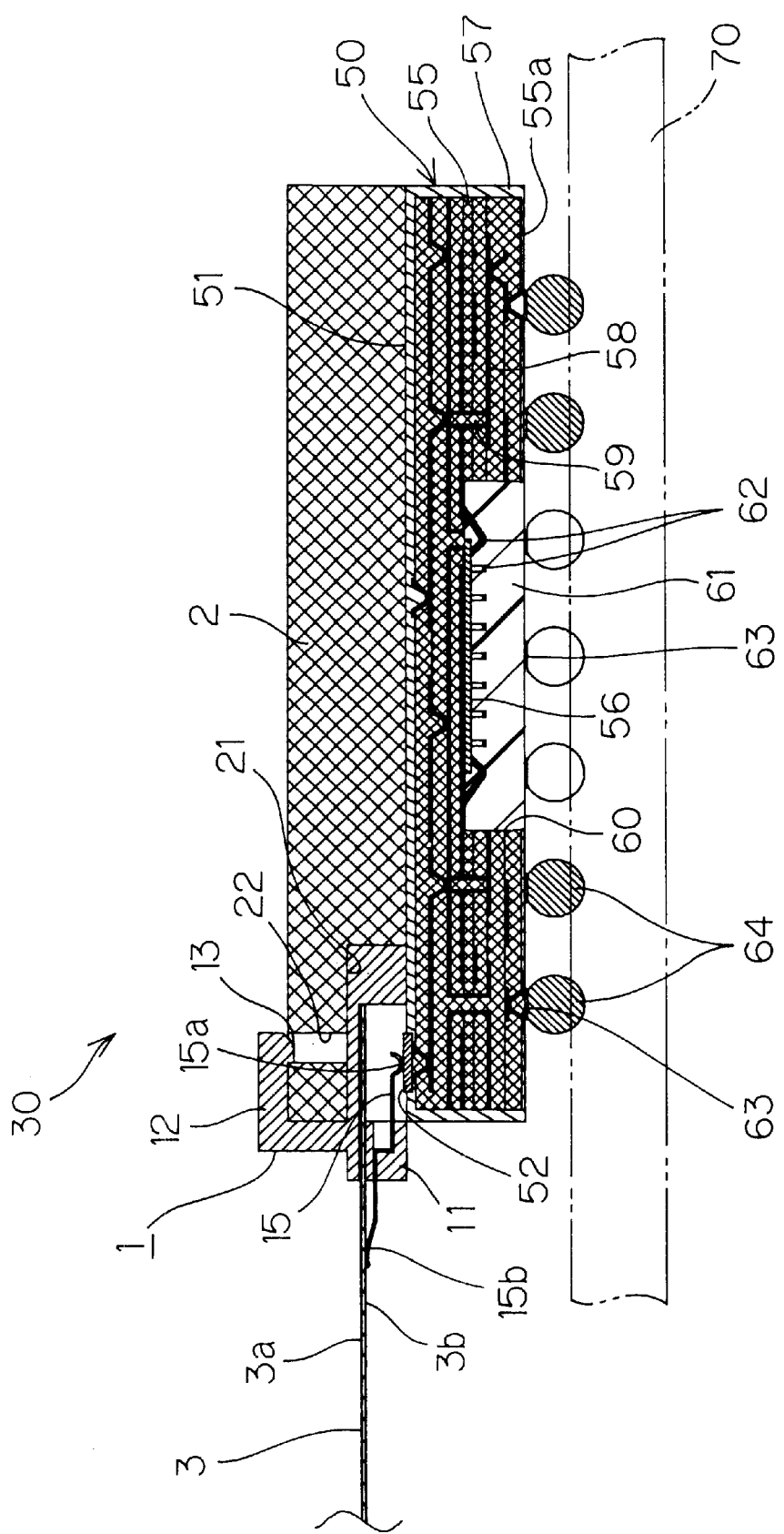
FIG. 2 is a sectional view illustrating a state where a connector is engaged with a connection block.
Figure 3:
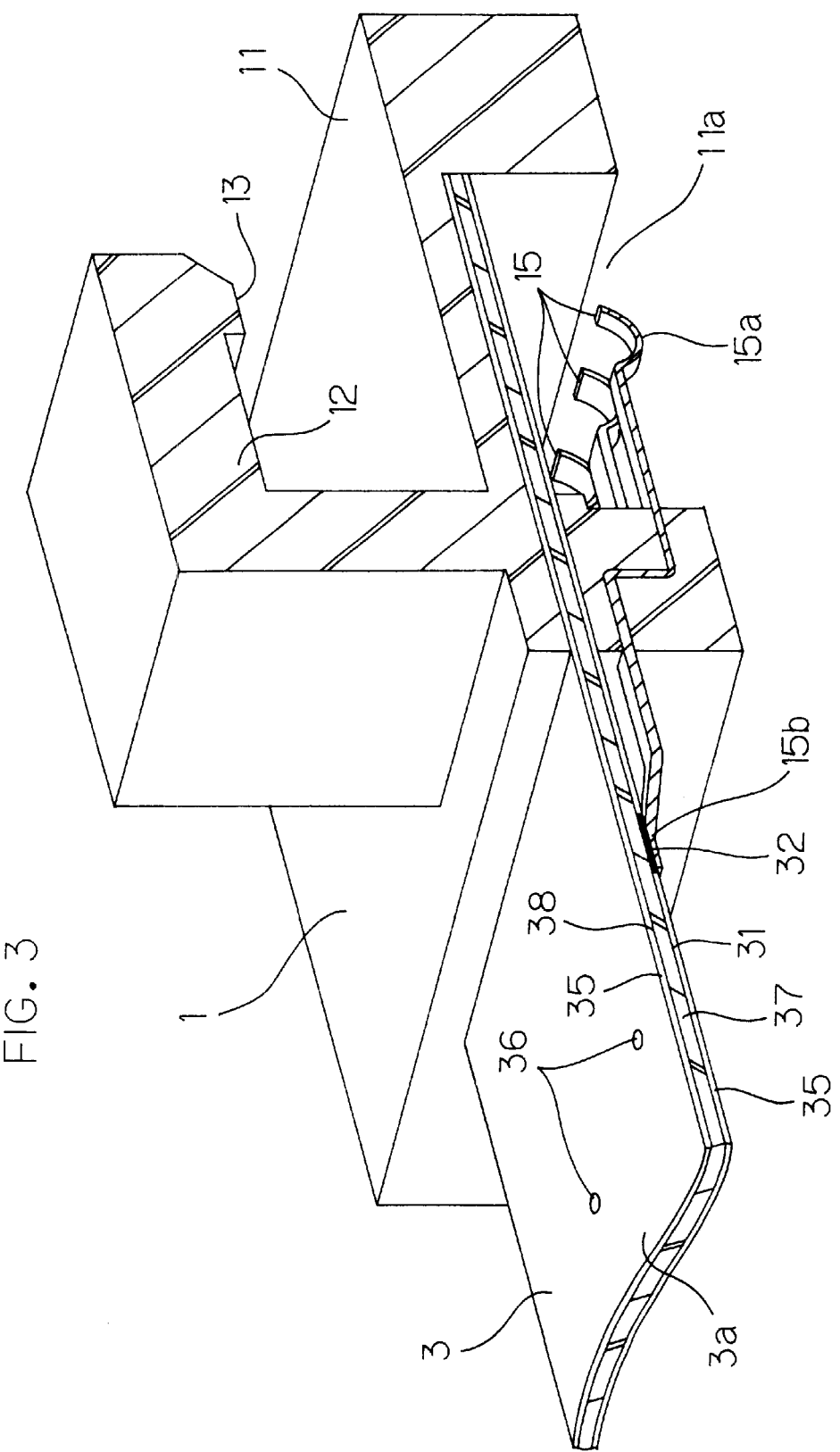
FIG. 3 is a perspective view partly in section illustrating the internal construction of a housing of the connector.

FIG. 2 is a sectional view illustrating the state where the connector 1 is engaged with the connection block 2. FIG. 3 is a perspective view partly in section illustrating the internal construction of the housing 11 of the connector 1. The connector 1 has a plurality of contacts 15 extending through the rear wall of the housing 11. The contacts 15 respectively have contact portions 15a provided at distal ends thereof to be brought into press contact with the rear electrodes 52 of the integrated circuit device 50 by spring forces of the contacts 15. The contact portions 15a of the plurality of contacts 15 are arranged in a recess 11a formed in a lower surface of the housing 11.

Rear end portions 15b of the contacts 15 extend outwardly of the rear face of the housing 11, and are respectively soldered to lands 32 of micro-strip conductors 31 provided on a lower surface 3b (opposite from the engagement piece 12) of the FPC cable 3.

The integrated circuit device 50 includes a multi-level interconnection board 55 and a semiconductor chip 56 which are molded with a resin 57. The multi-level interconnection board 55 includes a plurality of conductive films 58 which are selectively interconnected via conductive films 58 provided in through-holes 59. The multi-level interconnection board 55 has a recess 60 provided in a central portion of a surface 55a thereof opposed to the board 70. The semiconductor chip 56 is accommodated in the recess 60 and sealed in a mold resin 61.

Electrical connection between the semiconductor chip 56 and the conductor films 58 in the multi-level interconnection board 55 is established by bonding wires 62. A plurality of lands 63 are exposed from the resin 57 and two-dimensionally arranged on a portion of the board-opposed surface 55a of the multi-level interconnection board 55 not formed with the recess 60, and solder balls 64 are provided on the respective lands 63. The conductive films 58 and the through-holes 59 in the multi-level interconnection board 55 serve as internal interconnections for connection between the plurality of bonding wires 62 connected to the semiconductor chip 56 and the plurality of lands 63.

The rear electrodes 52 are exposed on the back surface 51 of the integrated circuit device 50. The rear electrodes 52 are electrically connected to the semiconductor chip 56 via the conductive films 58 in the multi-level interconnection board 55 and the bonding wires 62.

The integrated circuit device 50 is placed, for example, on the wiring board 70 and put in a reflow vessel in this state. Thus, the solder balls 64 are fused, whereby the integrated circuit device 50 is bonded to the wiring board 70.

FIG. 4 is a bottom view illustrating the connector and the FPC cable 3. The rear end portions 15b of the contacts 15 extend out of the housing 11, and are respectively soldered to the lands 32 of the micro-strip conductors 31 provided on the lower surface 3b of the FPC cable 3. The micro-strip conductors 31 are arranged parallel to each other so that signal lines 31S are disposed between ground lines 31G. The lands 32 of the respective micro-strip conductors 31 are exposed on the FPC cable in the vicinity of the connector 1. Lands 33 of the respective micro-strip conductors 31 are exposed on the FPC cable at an end of the FPC cable 3 opposite from the connector 1.

Figure 5A:
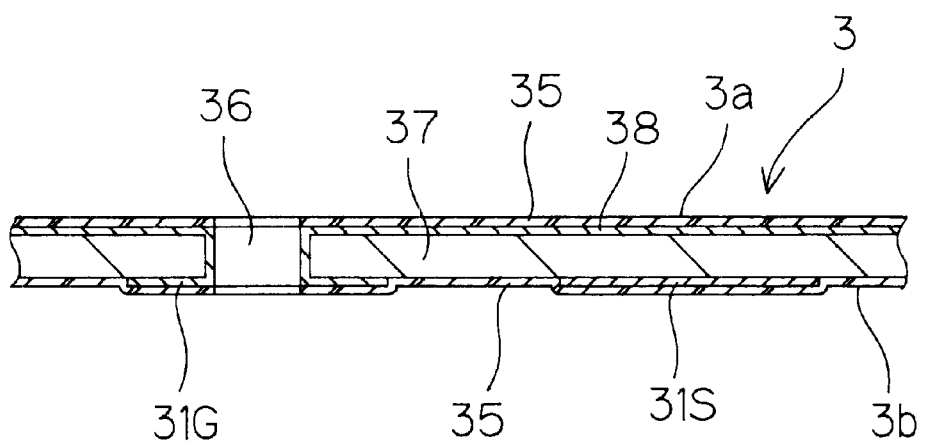
FIG. 5A is a sectional view taken along a section line VA—VA in FIG. 4.
Figure 5B:
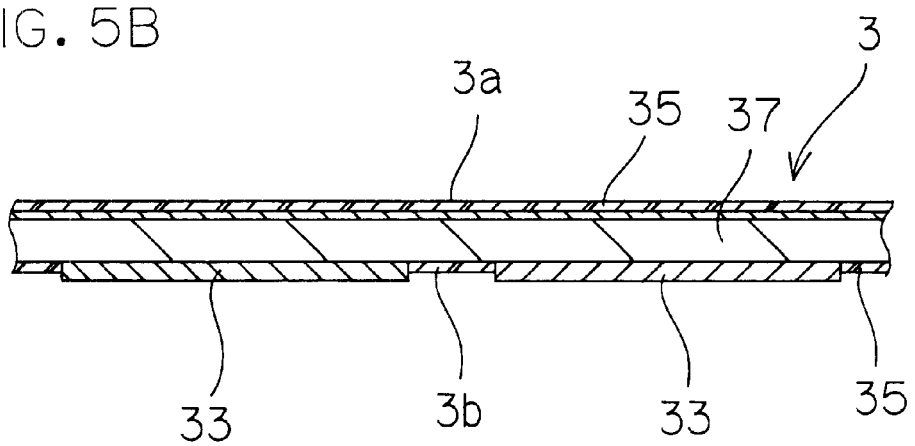
FIG. 5B is a sectional view taken along a section line VB—VB in FIG. 4.

FIG. 5A is a sectional view taken along a section line VA—VA in FIG. 4, and FIG. 5B is a sectional view taken long a section line VB—VB in FIG. 4. In FIGS. 5A and B, a part of the FPC cable 3 is illustrated in section on a vertically enlarged scale when the FPC cable 3 assumes a state shown in FIGS. 1A and 1B. An upper surface 3a and a lower surface 3b of the FPC cable 3 are covered with an insulative coating film 35. Only the lands 32, 33 are exposed from the coating film 35. As described above, the signal lines 31S are interposed between the ground lines 31G. The FPC cable 3 has a plurality of through-holes 36 provided in midportions of the ground lines 31G as extending therethrough. More specifically, the through-holes 36 extend through the micro-strip conductors 31 of the ground lines 31G from the lower surface 3b of the FPC cable 3 and further extend through a foundation 37 of the FPC cable 3 to reach the upper surface 3a of the FPC cable 3. A surface of the foundation 37 is entirely covered with a conductive film 38 on the side of the upper surface 3a of the FPC cable 3. The conductive film 38 is connected to a ground potential, for example, at the end of the FPC cable 3 opposite from the connector 1.

With the arrangement according to this embodiment described above, the integrated circuit device 50 has the rear electrodes 52 on the back surface 51 thereof, and the FPC cable 3 is connected to the rear electrodes 52 via the connector 1. Thus, signal lines of the integrated circuit device 50 can be led out to external devices not only via the wiring board 70 but also via the FPC cable 3. Where the multi-level interconnection board 55 is designed so that the rear electrodes 52 are used for high speed transmission of signals (e.g., from an LVDS driver) at a frequency of higher than 50 MHz, the high speed signal transmission can be achieved through the transmission paths outside the wiring board 70. Thus, the signals transmitted at a high rate via the FPC cable 3 are not influenced by signals transmitted via the wiring board 70, so that the waveforms thereof are prevented from being disturbed by crosstalk and noises. Since the FPC cable 3 includes the micro-strip conductors 31 arranged so that the signal lines 31S are disposed between the ground lines 31G to provide pseudo-coaxial transmission paths, the influence of inter-signal crosstalk and external noises can effectively be eliminated.

Figure 6:
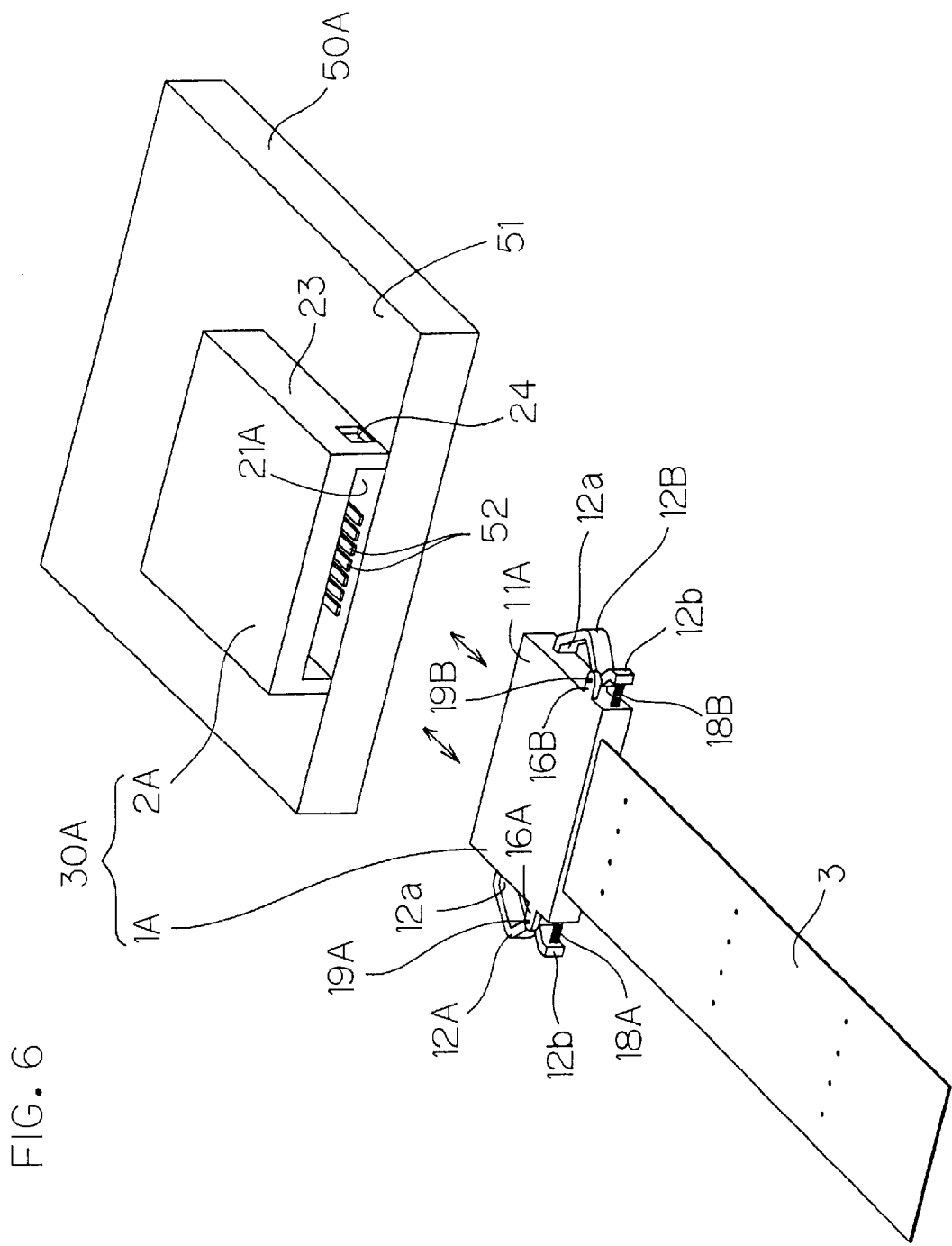
FIG. 6 is a perspective view for explaining the construction of a connector module according to a second embodiment of the present invention.

FIG. 6 is a perspective view for explaining the construction of a connector module 30A according to a second embodiment of the present invention. In FIG. 6, components equivalent to those shown in FIGS. 1A and 1B are denoted by the same reference characters as in FIGS. 1A and 1B.

In this embodiment, an integrated circuit device 50A having rear electrodes 52 on a back surface 51 thereof has substantially the same internal construction as the integrated circuit device 50 according to the first embodiment, except that a rectangular connection block 2A is integrally provided on the back surface 51. More specifically, the connection block 2A is molded simultaneously with resin-molding of a multi-level interconnection board and a semiconductor chip in the integrated circuit device 50A. In this embodiment, the connection block 2A has a smaller size than a main body (a portion excluding the connection block 2A) of the integrated circuit device 50A as viewed in plan.

The connection block 2A has an engagement recess 21A provided in a position to be opposed to a connector 1A (which, along with the connection block 2A, constitutes the connector module 30A) for engagement with the connector 1A. The rear electrodes 52 are exposed in the engagement recess 21A. The connection block 2A has lock recesses 24 respectively provided in opposite side faces 23 extending parallel to an insertion direction of the connector 1A.

The connector 1A includes a housing 11A to be inserted into the engagement recess 21A of the connection block 2A, a pair of lock claws 12A and 12B respectively provided on opposite side faces of the housing 11A, and a pair of compression coil springs 18A, 18B for biasing the lock claws 12A, 12B toward lock positions.

Pairs 16A and 16B of upper and lower support projections respectively project from the opposite side faces of the housing 11A. The lock claws 12A and 12B are respectively supported pivotally about shafts 19A and 19B fixed to the pairs 16A and 16B of support projections. The lock claws 12A, 12B each have an engagement tip 12a provided at a front end thereof for engagement with the lock recess 24 of the connection block 2A, and an operation portion 12b provided at a rear end thereof to be subjected to a biasing force exerted outwardly by the coil spring 18A, 18B. The shafts 19A and 19B respectively support portions of the lock claws 12A and 12B between the engagement tips 12a and the operation portions 12b.

An FPC cable 3 extends from a rear face of the housing 11A. The structure of the FPC cable 3 and the structure for connection between the FPC cable 3 and contacts within the housing 11A are the same as those according to the first embodiment. The contacts of the connector 1A have the same construction as the contacts 15 according to the first embodiment.

FIG. 7A is a perspective view illustrating a state where the connector 1A is attached to the connection block 2A. When the connector 1A is to be attached to the connection block 2A, the operation portions 12b of the lock claws 12A, 12B are held between fingers in a state shown in FIG. 6, and the connector 1A is moved toward the connection block 2A with the engagement tips 12a of the lock claws 12A, 12B being open. After the housing 11A is inserted to an insertion-complete position into the engagement recess 21A, the lock claws 12A, 12B are released from the fingers. The engagement tips 12a of the lock claws 12A, 12B are respectively brought into engagement with the lock recesses 24 by the action of the coil springs 18A, 18B as shown in FIG. 7A. Thus, the connector 1A and the connection block 2A are kept in engagement with each other.

When the connector 1A is to be detached from the connection block 2A, the operation portions 12b of the pair of lock claws 12A, 12B are held between fingers from opposite sides, as shown in FIG. 7B, to disengage the lock claws 12A, 12B from the lock recesses 24. In this state, the connector 1A is brought away from the connection block 2B.

Figure 8A:
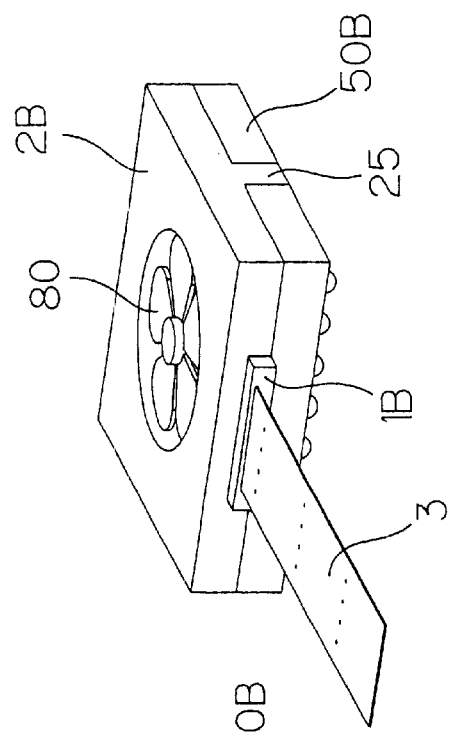
FIGS. 8A and 8B are perspective views for explaining the construction of a connector module according to a third embodiment of the present invention.
Figure 8B:
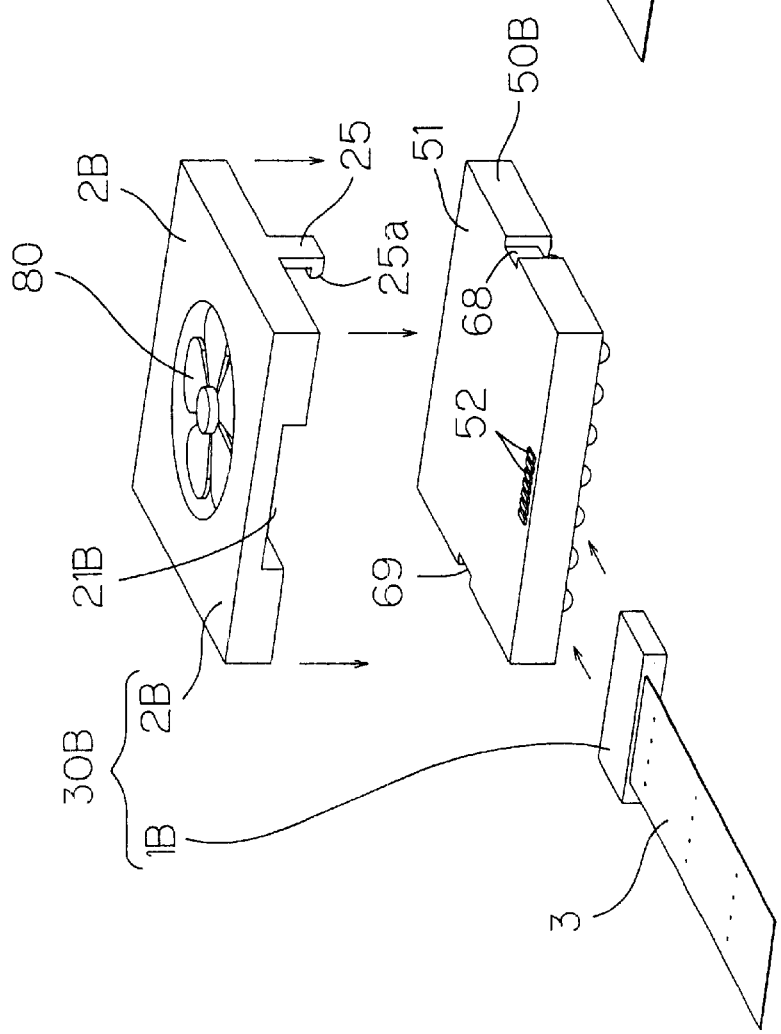

FIGS. 8A and 8B are perspective views for explaining the construction of a connector module 30B according to a third embodiment of the present invention. In FIGS. 8A and 8B, components equivalent to those shown in FIGS. 1A and 1B are denoted by the same reference characters as in FIGS. 1A and 1B.

In this embodiment, a pair of engagement recesses 68, 69 for engagement with a connection block 2B are respectively provided in opposite side faces of an integrated circuit device 50B (corresponding to the integrated circuit device body as a whole) having rear electrodes 52 on a back surface 51 thereof. The integrated circuit device 50B has the same internal construction as the integrated circuit device 50 according to the first embodiment.

A connection block 2B is of a planer rectangular shape, and has a pair of engagement claws 25 respectively provided in association with the engagement recesses 68, 69 as projecting toward the integrated circuit device 50B. Distal ends (lower ends) of the engagement claws 25 are inwardly bent in an L-shape to form claw portions 25a. The claw portions 25a are respectively brought into engagement with steps provided below the engagement recesses 68, 69, whereby the connection block 2B is firmly fixed to the integrated circuit device 50B. The fixed state is shown in FIG. 8B.

In this embodiment, a cooling fan 80 for cooling the integrated circuit device 50B from the back surface 51 thereof is incorporated in a generally central portion of the connection block 2B. As in the first and second embodiments, the connection block 2B has an engagement recess 21B provided in a position thereof to be opposed to the rear electrodes 52 for receiving a connector 1B which, along with the connection block 2B, constitutes the connection module 30B.

The connector 1B has substantially the same construction as the connector 1 according to the first embodiment, except that the connector 1B does not have the engagement piece 12. The connector 1B is connected to an FPC cable 3.

A state where the connector 1B is inserted in the engagement recess 21B is shown in FIG. 8B. In this state, a plurality of contacts of the connector 1B are electrically connected to the rear electrodes 52 of the integrated circuit device 50B.

As described above, the cooling fan 80 is incorporated in the connection block 2B which is to be attached to the back surface 51 of the integrated circuit device 50B in accordance with this embodiment. Therefore, the integrated circuit device 50B can efficiently be cooled. Even if the integrated circuit device 50B generates a greater amount of heat, malfunction thereof can be prevented.

While the three embodiments of the present invention have thus been described, the invention may be embodied in any other ways. Although the connector 1B does not have a lock mechanism in the third embodiment, the connector 1 having the engagement piece 12 shown in FIGS. 1A and 1B may be employed instead of the connector 1B. In this case, a lock hole 22 is provided in the connection block 2B for engagement with the engagement piece 12 as in the connection block 2 shown in FIGS. 1A and 1B.

In accordance with the aforesaid embodiments, the connector is designed so that the FPC cable 3 is led out parallel to the back surface 51 of the integrated circuit device. Where a space around the integrated circuit device is not sufficient for routing the FPC cable 3, however, a connector may be employed which is designed so that an FPC cable is led out perpendicularly to the back surface 51 of the integrated circuit device 50. In this case, a connection block to be connected to such a connector preferably has a connector engagement recess which opens upward perpendicularly to the back surface 51.

Although the pseudo-coaxial transmission paths are provided by employing the micro-strip conductors provided on the FPC cable 3 in accordance with the aforesaid embodiments, twisted-pair cables 90 each including a signal lead line 90S and a ground lead line 90G twisted with each other as shown in FIG. 9, for example, may be employed for the provision of the pseudo-coaxial transmission paths. Alternatively, flat cables or an FFC cable (flexible flat cable) may be employed for signal transmission from the connector 1 or the like to any other electronic device to provide the pseudo-coaxial transmission paths. Of course, coaxial cables may be employed for the signal transmission from the connector 1 or the like to any other electronic device.

In the third embodiment, the cooling fan is incorporated in the connection block for cooling the integrated circuit device. Alternatively, cooling fins may be provided on the connection block, for example, to allow the connection block to double as a heat sink for cooling the integrated circuit device.

Although the connection block is combined with the integrated circuit device with the use of the adhesive, by the integral molding or by the mechanical coupling with the use of the engagement claws in the aforesaid embodiments, any other methods such as ultrasonic fusion bonding and press insertion may be employed for combining the connection block with the integrated circuit device. Where the ultrasonic fusion bonding method is employed, for example, holes are formed in the back surface of the integrated circuit device, and resin projections are formed on the connection block in association with the holes. Then, the connection block is placed on the back surface of the integrated circuit device, and ultrasonic waves are externally applied to the connection block to fuse the resin projections, whereby the connection block is combined with the integrated circuit device. Where the press insertion method is employed, proper press insertion grooves or holes are formed in the integrated circuit device 50, and projections to be press-inserted into the press insertion grooves or holes are provided on the connection block.

In the aforesaid embodiments, the connector is attached to the integrated circuit device via the connection block. However, the connector may be attached directly to the back surface of the integrated circuit device with the use of an adhesive, by ultrasonic fusion bonding, or by proper fixing means such as an engagement claw without the use of the connection block.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Application No. 2000-128045 filed to the Japanese Patent Office on Apr. 27, 2000, the disclosure thereof being incorporated herein by reference.

What is claimed is:

1. A connector module to be connected to an integrated circuit having rear electrodes provided on a back surface thereof facing away from a wiring board upon which said integrated circuit device is mounted, the connector module comprising:
   a connector having contacts disposed in a connector recess formed in a bottom surface of the connector to be electrically connected to the rear electrodes; and
   a fixture structure for fixing the connector to the integrated circuit device, which comprises a connection block having a bottom connection block surface which is fixable at the bottom connection block surface to the back surface of the integrated circuit device and engageable with the connector with the bottom surface of the connector in contact with the back surface of the integrated circuit device.

2. A connector module as set forth in claim 1, further comprising a wiring member connected to the connector.

3. A connector module as set forth in claim 2, wherein the wiring member has a pseudo-coaxial structure.

4. A connector module as set forth in claim 1, wherein the fixture structure further comprises a lock mechanism for keeping the connector and the connection block in engagement with each other.

5. A connector module as set forth in claim 1, wherein the connection block incorporates a cooling mechanism for cooling the integrated circuit device.

6. An integrated circuit device comprising:
   an integrated circuit device body having rear electrodes provided on a back surface thereof facing away from a wiring board upon which said integrated circuit device body is mounted; and
   a connection block having a bottom connection block surface and a rear connection block surface extending perpendicularly to the bottom connection block surface, the connection block formed with an engagement recess extending through the rear connection block surface and into the connection block to expose the rear electrodes and a lock recess formed into an outer surface of the connection block, the connection block fixed at the bottom connection block surface to the back surface of the integrated circuit device body, and engageable with a connector having a housing with a bottom surface and a housing recess formed into the bottom surface, a lock mechanism having a lock claw and contacts to be electrically connected to the rear electrodes, the contacts disposed in the housing recess, projecting therefrom and movable to retract into the housing recess in a resiliently biased manner, wherein the connector slides into the engagement recess in an insertion direction causing the contacts to be electrically connected to the rear electrodes in a resiliently biased manner with the bottom surface of the connector in contact with the back surface of the integrated circuit device and the lock claw to engage the lock recess in a direction generally perpendicularly to the insertion direction so that the lock mechanism keeps the connector and the connection block in engagement with each other.

7. A connector module-attached integrated circuit device, comprising:
   an integrated circuit device body having rear electrodes provided on a back surface thereof facing away from a wiring board upon which said integrated circuit device body is mounted; and
   a connector module comprising a connector having contacts disposed in a connector recess formed in a bottom surface of the connector to be electrically connected to the rear electrodes, and a fixture structure, which includes a connection block having a bottom connection block surface that is fixable at the bottom connection block surface to the back surface of the integrated circuit device and engageable with the connector with the bottom surface of the connector in contact with the back surface of the integrated circuit device, for fixing the connector to the integrated circuit device body.

8. An integrated circuit device as set forth in claim 7, wherein the rear electrodes are electrodes through which signals having a frequency of not lower than 50 MHz are inputted or outputted.

9. A connector module-attached integrated circuit device as set forth in claim 7, wherein said fixture structure comprises a lock mechanism for keeping the connector and the connection block in engagement with each other.

10. A connector module-attached integrated circuit device as set forth in claim 7, wherein said fixture structure incorporates a cooling mechanism for cooling the integrated circuit device.

11. A connector module-attached integrated circuit device as set forth in claim 7, further comprising a wiring member connected to the connector.

12. A connector module-attached integrated circuit device as set forth in claim 11, wherein the wiring member has a pseudo-coaxial structure.

13. An integrated circuit device comprising:

an integrated circuit device body having rear electrodes provided on a back surface thereof facing away from a wiring board upon which said integrated circuit device body is mounted; and a connection block having a bottom connection block surface, fixed to the back surface of the integrated circuit device body at the bottom connection block surface, and engageable with a connector having contacts disposed in a connector recess formed in a bottom surface of the connector to be electrically connected to the rear electrodes with the bottom surface of the connector in contact with the back surface of the integrated circuit device.

14. An integrated circuit device as set forth in claim 13, wherein said connection block comprises a lock mechanism for keeping the connector and the connection block in engagement with each other.

15. An integrated circuit device as set forth in claim 13, wherein the connection block incorporates a cooling mechanism for cooling the integrated circuit device.

16. A connector module to be connected to an integrated circuit device having rear electrodes provided on a back surface thereof facing away from a wiring board upon which said integrated circuit device is mounted, the connector module comprising:

a connector having a housing with a bottom surface and a housing recess formed into the bottom surface, a lock mechanism having a lock claw and contacts to be electrically connected to the rear electrodes, the contacts disposed in the housing recess, projecting therefrom and movable to retract into the housing recess in a resiliently biased manner; and a fixture structure for fixing the connector to the integrated circuit device, which comprises a connection block having a rear connection surface and a bottom connection block surface extending perpendicularly to the rear connection block surface, the connection block having an engagement recess extending into the rear connection block surface of the connection block to expose the rear electrodes and sized to slidably receive the connector and a lock recess formed into an outer surface of the connection block and fixable at the bottom connection block surface to the back surface of the integrated circuit device and engageable with the connector wherein the connector slides into the engagement recess in an insertion direction causing the contacts to be electrically connected to the rear electrodes in a resiliently biased manner with the bottom surface of the connector in contact with the back surface of the integrated circuit device and the lock claw to engage the lock recess in a direction generally perpendicularly to the insertion direction so that the lock mechanism keeps the connector and the connection block in engagement with each other.

17. A connector module-attached integrated circuit device, comprising:

an integrated circuit device body having rear electrodes provided on a back surface thereof facing away from a wiring board upon which said integrated circuit device body is mounted; and a connector module including:

a connector having a housing with a bottom surface and a housing recess formed into the bottom surface, a lock mechanism having a lock claw and contacts to be electrically connected to the rear electrodes, the contacts disposed in the housing recess, projecting therefrom and movable to retract into the housing recess in a resiliently biased manner, and a fixture structure, which includes a connection block having a rear connection block surface and a bottom connection block surface extending perpendicularly to the rear connection block surface, the connection block having an engagement recess sized to slidably receive the connector and extending into the rear connection block surface of the connection block to expose the rear electrodes and a lock recess formed into an outer surface of the connection block and fixable at the bottom connection block surface to the back surface of the integrated circuit device to fix the connection block to the integrated circuit device and engageable with the connector wherein the connector slides into the engagement recess in an insertion direction causing the contacts to be electrically connected to the rear electrodes in a resiliently biased manner with the bottom surface of the connector in contact with the back surface of the integrated circuit device and the lock claw to engage the lock recess in a direction generally perpendicularly to the insertion direction so that the lock mechanism keeps the connector and the connection block in engagement with each other.

* * * * *